United States Patent
Chen et al.

(10) Patent No.: US 11,081,339 B2
(45) Date of Patent: Aug. 3, 2021

(54) SINGLE-CRYSTAL RARE EARTH OXIDE GROWN ON III-V COMPOUND

(71) Applicant: Taiwan Semiconductor Manufacturing Co., Ltd., Hsinchu (TW)

(72) Inventors: Kuanhsiung Chen, Hsin-Chu (TW); Minghwei Hong, Hsin-Chu (TW); Jueinai Kwo, Hsin-Chu (TW); Yen-Hsun Lin, Hsin-Chu (TW); Keng-Yung Lin, Hsin-Chu (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 59 days.

(21) Appl. No.: 16/393,570

(22) Filed: Apr. 24, 2019

(65) Prior Publication Data
US 2019/0252184 A1   Aug. 15, 2019

Related U.S. Application Data

(62) Division of application No. 15/166,338, filed on May 27, 2016, now Pat. No. 10,283,349.

(51) Int. Cl.
*H01L 29/04* (2006.01)
*H01L 29/51* (2006.01)
(Continued)

(52) U.S. Cl.
CPC .... *H01L 21/02192* (2013.01); *H01L 21/0228* (2013.01); *H01L 21/0262* (2013.01); *H01L 21/02381* (2013.01); *H01L 21/02395* (2013.01); *H01L 21/02433* (2013.01); *H01L 21/02455* (2013.01); *H01L 21/02516* (2013.01);
(Continued)

(58) Field of Classification Search
CPC ......... H01L 21/02433; H01L 21/38364; H01L 21/3141; H01L 21/3142; C30B 29/403; C30B 29/406
See application file for complete search history.

(56) References Cited

U.S. PATENT DOCUMENTS 6,469,357 B1   10/2002  Hong et al.
6,548,424 B2   4/2003   Putkonen
(Continued)

OTHER PUBLICATIONS

Fundamentals of III-V Semiconductor MOSFETs, Springer 2010, edited by Serge Oktyabrsky and Peide D. Ye. (Year: 2010).*
(Continued)

*Primary Examiner* — Eric A. Ward
(74) *Attorney, Agent, or Firm* — Haynes and Boone, LLP

(57) ABSTRACT

A substrate with a (001) orientation is provided. A gallium arsenide (GaAs) layer is epitaxially grown on the substrate. The GaAs layer has a reconstruction surface that is a 4×6 reconstruction surface, a 2×4 reconstruction surface, a 3×2 reconstruction surface, a 2×1 reconstruction surface, or a 4×4 reconstruction surface. Via an atomic layer deposition process, a single-crystal structure yttrium oxide ($Y_2O_3$) layer is formed on the reconstruction surface of the GaAs layer. The atomic layer deposition process includes water or ozone gas as an oxygen source precursor and a cyclopentadienyl-type compound as an yttrium source precursor.

20 Claims, 6 Drawing Sheets

(51) Int. Cl.
   *H01L 21/02*    (2006.01)
   *H01L 29/20*    (2006.01)
   *H01L 29/66*    (2006.01)
   *H01L 21/28*    (2006.01)

(52) U.S. Cl.
   CPC .. *H01L 21/02565* (2013.01); *H01L 21/02631* (2013.01); *H01L 21/28264* (2013.01); *H01L 29/045* (2013.01); *H01L 29/20* (2013.01); *H01L 29/517* (2013.01); *H01L 29/66522* (2013.01); *H01L 29/66568* (2013.01); *H01L 29/513* (2013.01)

(56) References Cited

U.S. PATENT DOCUMENTS

| | | | |
|---|---|---|---|
| 6,858,546 B2 | 2/2005 | Niinisto et al. | |
| 6,890,816 B2 * | 5/2005 | Liang | C30B 25/18 |
| | | | 438/252 |
| 6,914,312 B2 | 7/2005 | Nishikawa et al. | |
| 7,442,654 B2 | 10/2008 | Droopad et al. | |
| 7,655,327 B2 | 2/2010 | Atanackovic | |
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 9,214,518 B1 | 12/2015 | Chu et al. | |
| 9,589,827 B2 | 3/2017 | Cheng et al. | |
| 2003/0071327 A1 | 4/2003 | Ooms et al. | |
| 2011/0089469 A1 | 4/2011 | Merckling | |
| 2014/0282326 A1 | 9/2014 | Chen et al. | |
| 2018/0135202 A1* | 5/2018 | Doolittle | H01L 21/0242 |

OTHER PUBLICATIONS

Yiqun Liu et al. "Heteroepitaxy of Single-Crystal LaLuO 3 on GaAs(111)A by Atomic Layer Deposition" Applied Physics Letters 97, 162910 (2010), 4 pages.

* cited by examiner

SINGLE-CRYSTAL RARE EARTH OXIDE GROWN ON III-V COMPOUND

PRIORITY DATA

The present application is a divisional application of U.S. patent application Ser. No. 15/166,338, filed on May 27, 2016, entitled "Single-Crystal Rare Earth Oxide Grown On III-V Compound", the disclosure of which is hereby incorporated by reference in its entirety.

BACKGROUND

In semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

As the semiconductor technology fabrication node progresses beyond the 10-nanometer node, it may need to form a high-k dielectric material on a III-V group compound. Atomic layer deposition has been a proven mass production technique for forming the high-k dielectric material on a III-V group compound. Certain rare earth oxide compounds have been used as the high-k dielectric material. However, existing semiconductor fabrication technologies have not been able to grow single-crystal rare earth oxides on a III-V compound having a (001) surface, which is needed for the integration with silicon substrates having the (001) surface.

Therefore, while existing techniques of forming rare earth oxides on III-V compounds have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
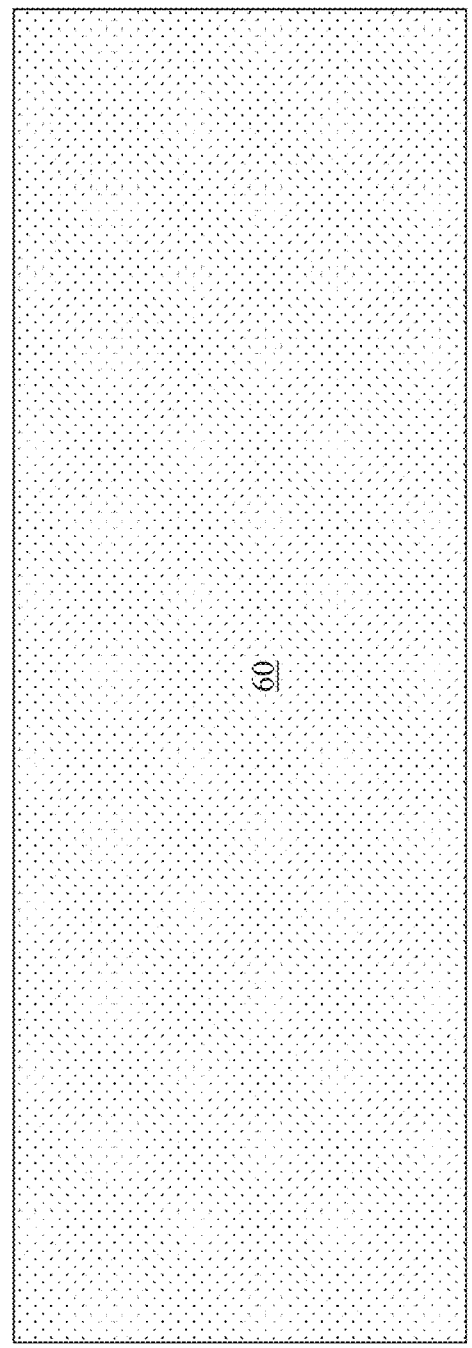
FIGS. 1-5 are cross-sectional side views of a semiconductor device at different stages of fabrication according to various embodiments of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

As the semiconductor technology fabrication node progresses beyond the 10-nanometer node, it may need to form a high-k dielectric material on a III-V group compound such as gallium arsenide (GaAs). The high-k dielectric material offers benefits such as higher dielectric constants, and the III-V compound offers benefits such as high electron mobility. For commercial application and for non-planar devices such as FinFETs, atomic layer deposition (ALD) has been a proven mass production technique. ALD is often needed for depositing high-k gate dielectrics. Rare earth oxide materials such as yttrium oxide ($Y_2O_3$) may be used as a high-k dielectric. Thus, the fabrication of transistors for advanced semiconductor technology nodes may need to use ALD to form a rare earth oxide (as a high-k dielectric) on a III-V compound such as GaAs.

However, the Fermi levels at the high-k dielectric/III-V compound material are generally pinned with high interfacial trap densities, which may cause failure of realizing high-performance inversion-channel high-k/GaAs MOSFETs. In addition, previous efforts were able to use ALD to grow single-crystal rare earth oxides on GaAs with a (111) orientation, but not on GaAs with a (001) orientation. Yet GaAs with the (111) orientation may not be used feasibly in mass production, as the integration with silicon demands the growth of III-V compounds (such as GaAs) in a (001) orientation.

To address the various issues discussed above in existing semiconductor fabrication, the present disclosure allows for the growth of a rare earth oxide (e.g., $Y_2O_3$) on a III-V compound (e.g., GaAs) having a (001) orientation, as discussed in more detail below with reference to FIGS. 1-5.

FIGS. 1-5 are simplified diagrammatic fragmentary cross-sectional side views of a semiconductor device 50 at various stages of fabrication. The semiconductor device 50 is fabricated under a semiconductor technology node that is 10-nanometers or lower. The semiconductor device 50 may include an integrated circuit (IC) chip, system on chip (SoC), or portion thereof, and may include various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, or other types of transistors.

Referring to FIG. 1, the semiconductor device 50 includes a substrate 60. In some embodiments, the substrate 60 is a single-crystal silicon substrate with a silicon (001) orientation according to a Miller Index. In other embodiments, the substrate 60 is a III-V compound substrate with a (001) orientation. A III-V compound material includes a compound that contains at least an element from a "III" group (or family) of the periodic table, and at least another element from a "V" group (or family) of the periodic table. For example, the III group elements may include Boron, Aluminum, Gallium, and Indium, and the V group elements may include Nitrogen, Phosphorous, Arsenic, Antimony, and Bismuth. In some embodiments, the substrate 60 is a gallium arsenide (GaAs) substrate (e.g., as a III-V group compound substrate) with a (001) orientation.

Figure 2:
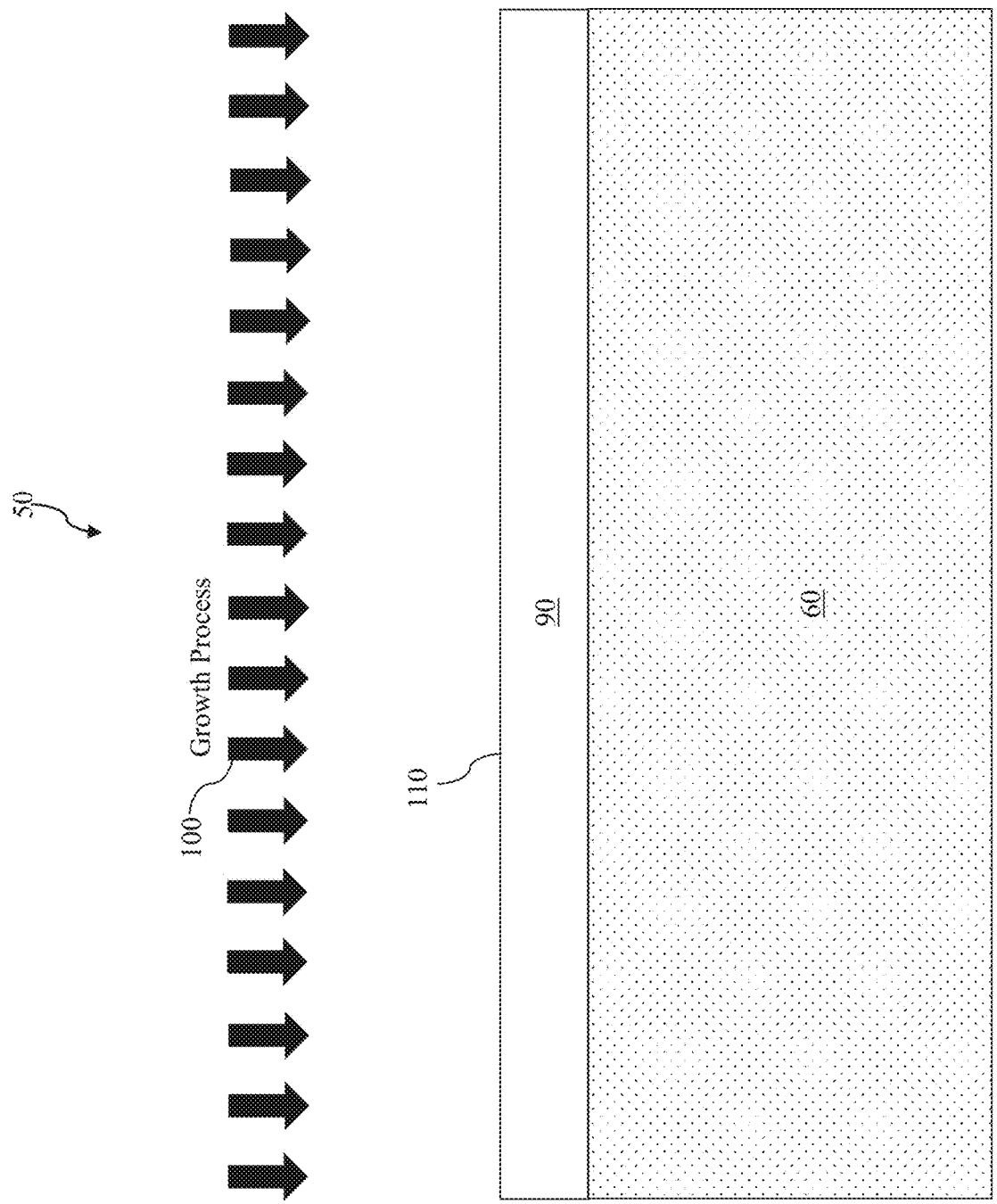

Referring now to FIG. 2, a III-V compound epi-layer 90 is formed on the substrate 60. The III-V compound epi-layer 90 is formed via a growth process 100. The growth process 100 may include an epitaxial growth process. Since the substrate 60 may be a (001) silicon substrate in some embodiments, or it may be a (001) GaAs substrate in other embodiments, the III-V compound epi-layer 90 may be epitaxially grown on either the (001) silicon substrate or on the (001) GaAs substrate.

In some embodiments, the epitaxial growth process is performed in a molecular beam epitaxy (MBE) system. In a molecular beam epitaxy system, the epitaxial growth process takes place in a high vacuum environment (e.g., in an environment with a pressure less than 100 nano-pascals). The molecular beam epitaxy system also does not need to use carrier gases to grow the target film (i.e., the layer 90). The absence of carrier gases as well as the high vacuum environment allows the molecular beam epitaxy system to grow high-quality films, for example films with high-purity. Of course, it is understood that the molecular beam epitaxy system is not the only system that is capable of growing the epi-layer 90. In other embodiments, the III-V compound epi-layer 90 may be formed using a Metal-Organic Chemical Vapour Deposition (MOCVD) system as well.

In some embodiments, the III-V compound epi-layer 90 contains GaAs. In other embodiments, the III-V compound epi-layer 90 may contain another suitable III-V compound material such as gallium indium arsenide (GaInAs), gallium antimonide (GaSb), indium arsenide (InAs), indium phosphide (InP), gallium indium phosphide (GaInP), or gallium indium antimonide (GaInSb).

Since the substrate 60 has a single-crystal structure, the III-V compound epi-layer 90 is formed to have a single-crystal structure as well. In addition, the III-V compound epi-layer 90 is formed to have a reconstruction surface 110. The reconstruction surface 110 means that the atoms of the III-V compound epi-layer 90 at the surface 110 assume a different crystal structure than the atoms of the rest of the III-V compound epi-layer 90 (i.e., away from the surface 110). In more detail, in an ideal infinite crystal, the individual atoms' equilibrium positions are determined by the forces exerted by all the other atoms in the crystal. Typically, the equilibrium positions result in a periodic structure. However, when the crystal is cut along a certain plane (thereby creating a surface), then the forces are altered, thereby causing a change in the remaining atoms' equilibrium positions. The change in equilibrium positions is most pronounced for the atoms at the cut-plane/surface, since these atoms no longer experience the forces exerted by all the other atoms in all directions. As a result, the atoms of the crystal near the cut-plane/surface may have different spacing or symmetry from the atoms in the rest of the crystal. This process may be referred to as a surface reconstruction, and the cut-plane/surface (in this case, the surface 110) may be referred to as a reconstruction surface.

Different types of reconstruction surfaces may be produced depending on factors such as the type of substrate and ambient conditions. The specific type of reconstruction surface may be denoted by Wood's notation as: X(hkl)m× n–R$\phi$, where hkl represents the miller index (e.g., (001), (100), etc.), m and n represent the atomic spacings multiplied by m and n in the basic translation vectors of a two-dimensional structure, and R$\phi$ represents a rotation angle. For purposes of the present disclosure, the rotation angle R$\phi$ is omitted when different reconstruction surfaces are discussed below.

In some embodiments, the reconstruction surface 110 has a 4×6 reconstruction surface. In another embodiment, the reconstruction surface 110 has a 2×4 reconstruction surface. In yet another embodiment, the reconstruction surface 110 has a 3×2 reconstruction surface. In one more embodiment, the reconstruction surface 110 has a 2×1 reconstruction surface. In a further embodiment, the reconstruction surface 110 has a 4×4 reconstruction surface.

The different types of reconstruction surfaces 110 may be obtained through an Ultra High Vacuum (UHV) annealing process. The UHV annealing process may be performed in an annealing chamber in a high vacuum environment (e.g., in an environment with a pressure less than 100 nano-pascals). In other embodiments, the reconstruction surface 110 may be obtained without needing the UHV chamber, as long as the corresponding annealing chamber (which may have a less vacuum environment than the UHV chamber) contains no oxygen, water, and carbon-oxygen species.

In some embodiments, the annealing process for obtaining the reconstruction surface 110 is performed at a temperature in a range from about 350 degrees Celsius to about 620 degrees Celsius, and with a process duration in a range for longer than about 1 minute (e.g., with a time duration between about 1 minute to about 30 minutes).

In order to achieve the different reconstruction surfaces (e.g., 4×6, 2×4, etc.), the relevant process parameters need be varied. For general practice, GaAs surface is maintained at 2×4 reconstruction. Other surface reconstructions can be attained after stopping the epi-layer growth with different substrate temperature and Arsenic over pressure. The parameters to attain different surface reconstructions are dependent on factors such as the growth chamber configurations, growth temperature, and the growth rate. For example, the 4×6 reconstruction surface is obtained with an annealing temperature in a range from about 450 degrees Celsius to about 600 degrees Celsius with less Arsenic pressure. The 3×2 reconstruction surface is obtained in a growth window of intermediate molecular beam flux ratio of Arsenic over Gallium between 5 to 10 during the GaAs epi-layer growth. The 2×4 reconstruction surface is obtained on an as-grown GaAs epi-layer with an Arsenic over-pressure. The 2×1 reconstruction surface is obtained by a sulfur passivation or removing the native oxide layer in a UHV annealing process over 580 to 630 degree Celcius. The 4×4 reconstruction surface is obtained with Arsenic over-pressure and substrate temperature below about 450 degree Celsius.

There are various approaches to prepare the reconstruction surface 110. In the present embodiment, so surface treatment is performed to the reconstruction surface 110. In other words, the reconstruction surface 110 is a pristine surface. In some other embodiments, a chemical treatment is performed to the reconstruction surface 110. The chemical treatment may include rinsing the reconstruction surface 110 in Ammonia Sulfide, Hydrogen fluoride (HF), Hydrogen Chloride(HCl), or Ammonia Chloride ($NH_4Cl$), or combinations thereof. In yet other embodiments, a thermal treatment is performed to the reconstruction surface 110. In some further embodiments, an anodic treatment is performed to the reconstruction surface 110. In other embodiments, a plasma treatment is performed to the reconstruction surface 110. The plasma treatment may include applying hydrogen plasma or nitrogen plasma. In yet further embodiments, a UHV treatment is performed to the reconstruction surface 110. The UHV treatment may include UHV annealing for removing oxide or capping layer.

Figure 3:
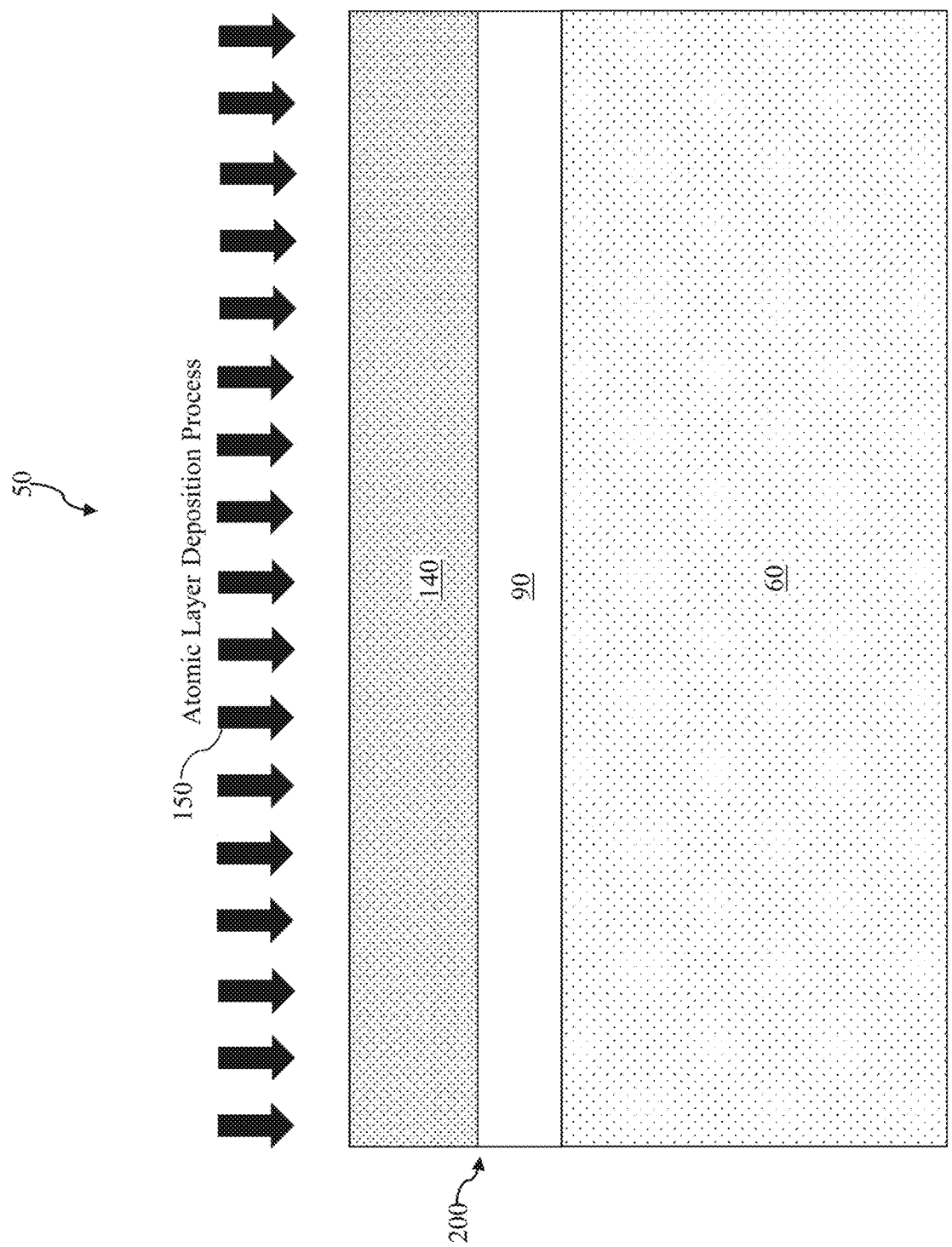

Referring now to FIG. 3, a rare earth oxide layer 140 is formed on the reconstruction surface 110 of the III-V compound epi-layer 90. Rare earth oxides are formed at least in part using a rare earth element and oxygen. A rare earth element may be one of the fifteen lanthanides, or scandium or yttrium.

In the present embodiment, the rare earth oxide layer 140 contains yttrium oxide ($Y_2O_3$). In other embodiments, the rare earth oxide layer 140 may contain scandium oxide ($Sc_2O_3$), lanthanum oxide ($La_2O_3$), cerium oxide ($Ce_2O_3$), praseodymium oxide ($Pr_2O_3$), neodymium oxide ($Nd_2O_3$), samarium oxide ($Sm_2O_3$), europium oxide ($Eu_2O_3$), gadolinium oxide ($Gd_2O_3$), dysprosium oxide ($Dy_2O_3$), holmium oxide ($Ho_2O_3$), erbium oxide ($Er_2O_3$), lutetium oxide ($Lu_2O_3$) and rare earth oxide consisting of more than 1 rare earth elements. Other compound oxides containing rare earth element such as yttrium aluminum oxide ($YAlO_3$), lanthanum aluminum oxide ($LaAlO_3$), lanthanum lutetium oxide ($LaLuO_3$), lanthanum gallium oxide ($LaGaO_3$), and neodymium aluminum oxide ($NdAlO_3$). In some embodiments, rare earth oxides may contain combinations of the aforementioned oxides.

The rare earth oxide layer 140 is formed by an atomic layer deposition process 150. As discussed above, atomic layer deposition is a proven technique for mass production of semiconductor devices. In an atomic layer deposition process, two gaseous (or liquid) chemicals—known as precursors—are used to expose the surface of a material below one at a time in a sequential manner via alternating pulses. Through the repeated exposure to separate precursors, a desired film (such as the rare earth oxide layer 140) is deposited. There are different types of atomic layer deposition techniques. In the present embodiment, the atomic layer deposition process 150 includes a thermal atomic layer deposition. In other embodiments, the atomic layer deposition process 150 includes a plasma-enhanced atomic layer deposition. In yet other embodiments, the atomic layer deposition process 150 includes a spatial atomic layer deposition.

In order to form yttrium oxide, the precursors of the atomic layer deposition process 150 include an oxygen source precursor and an yttrium source precursor. In the present embodiment, the oxygen source precursor includes water ($H_2O$). In other embodiments, the oxygen source precursor includes ozone gas ($O_3$). In yet another embodiment, the oxygen source precursor includes plasma-excited oxygen. In the present embodiment, the yttrium source precursor includes a cyclopentadienyl-type compound precursor, such as $Y(Etcp)_3$. Alternatively, the cyclopentadienyl-type compound precursor may include $Y(MeCp)_3$ or $Y(Cp)_3$. In various other embodiments, the yttrium source precursor may one include $Y(thd)_3$, $YCl_3$, β-diketonate type precursors for yttrium, or $Y(iPr_2amd)_3$.

The various process parameters of the atomic layer deposition process 150 are also carefully configured to facilitate the growth of the rare earth oxide layer 140. In the present embodiment, a growth temperature of the atomic layer deposition process 150 is in a range from about 270 degrees Celsius to about 320 degrees Celsius to form yttrium oxide as the rare earth oxide layer 140. In other embodiments, the growth temperature of the atomic layer deposition process 150 may be in a range from about 150 degrees Celsius to about 425 degrees Celsius to form yttrium oxide as the rare earth oxide layer 140. In yet other embodiments, the growth temperature of the atomic layer deposition process 150 may be in a range from about 100 degrees Celsius to about 450 degrees Celsius to form other types of rare earth oxides as discussed above.

In the present embodiment, a growth pressure of the atomic layer deposition process 150 is in a range from about 4 hectopascals (hPa) (1 hPa=100 pascals) to about 10 hPa. In the present embodiment, an exposure time of the atomic layer deposition process 150 is in a range between about 1 second and about 3 seconds. In other embodiments, the exposure time of the atomic layer deposition process 150 is greater than 1 second. In some embodiments, a purge time of the atomic layer deposition process 150 is greater than about 8 seconds. In some embodiments, a ration of the purge time to the exposure time is greater than about 3 seconds. In some embodiments, the oxygen precursor temperature is at or near room temperature (e.g., 25 degrees Celsius). In some embodiments, the yttrium source precursor temperature is greater than about 110 degrees Celsius. For example, in the present embodiment, the yttrium source precursor temperature is greater than about 170 degrees Celsius.

The rare earth oxide layer 140 formed by the atomic layer deposition process 150 has a single-crystal structure. This is at least partially due to the fact that the III-V compound epi-layer 90 is formed with a single-crystal structure and a 4×6 reconstruction surface 110 (or 2×4, 3×2, 2×1, or 4×4 reconstruction surface in other embodiments). The single-crystal structure of the III-V compound epi-layer layer 90 and its 4×6 reconstruction surface 110, as well as the carefully tuned process parameters of the atomic layer deposition process 150 discussed above, allow the rare earth oxide layer 140 to also be formed with the single-crystal structure. In comparison, existing semiconductor technologies have not been able to produce a single-crystalline rare earth oxide on a III-V compound.

The rare earth oxide layer 140 and the III-V compound epi-layer 90 also form an interface 200. The interface 200 has a high quality. For example, its interfacial roughness is less than about 0.5 nanometers, which is better than interfaces formed by rare earth oxides formed on III-V materials according to conventional methods. Experimental data has also confirmed that the interface 200 is thermally stable up to about 950 degrees Celsius. The high thermal stability of the interface 200 between the rare earth oxide layer 140 and the III-V compound epi-layer 90 means that the present disclosure does not need to form the transistor according to a "gate-last" approach of fabrication. In more detail, according to the "gate-last" fabrication process flow (also known as a gate replacement process) to form high-k metal gates, a dummy gate electrode (and possibly a dummy gate dielectric as well) is formed first and then subsequently removed and replaced by the metal gate electrode (and possibly the high-k gate dielectric) later. As an example, the details of forming high-k metal gate structures are described in detail in U.S.

patent application Ser. No. 13/440,848, filed on Apr. 5, 2012, entitled "Cost-effective gate replacement process" to Zhu et al., which is issued as U.S. Pat. No. 8,753,931 on Jun. 17, 2014, the disclosure of which is hereby incorporated by reference in its entirety. The rationale for forming dummy gates first and then replacing them later with high-k metal gates later is at least in part due to thermal budget concerns. Here, since the interface 200 can remain thermally stable up to 950 degrees Celsius, it is foreseeable that future semiconductor fabrication incorporating the present disclosure may not need to perform a "gate-last" process anymore. Instead, the conventional and less costly "gate-first" process may be feasible, once the aspects of the present disclosure are implemented. The gate-first process does not involve forming dummy gates and then replacing them after the formation of source/drain. Rather, a functional gate (i.e., non-dummy gate) is formed before the formation of source/drain regions.

Figure 4:
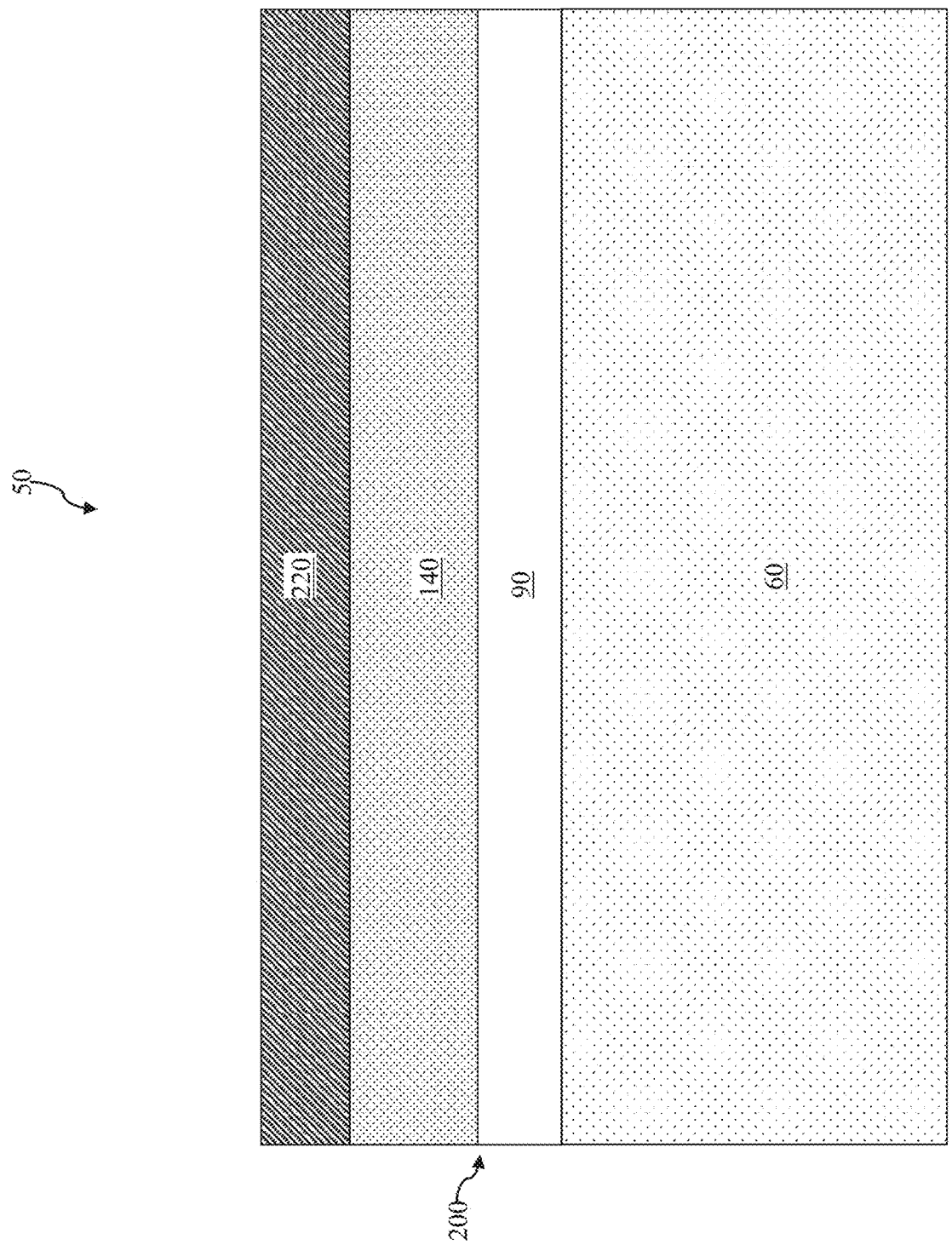
Figure 5:
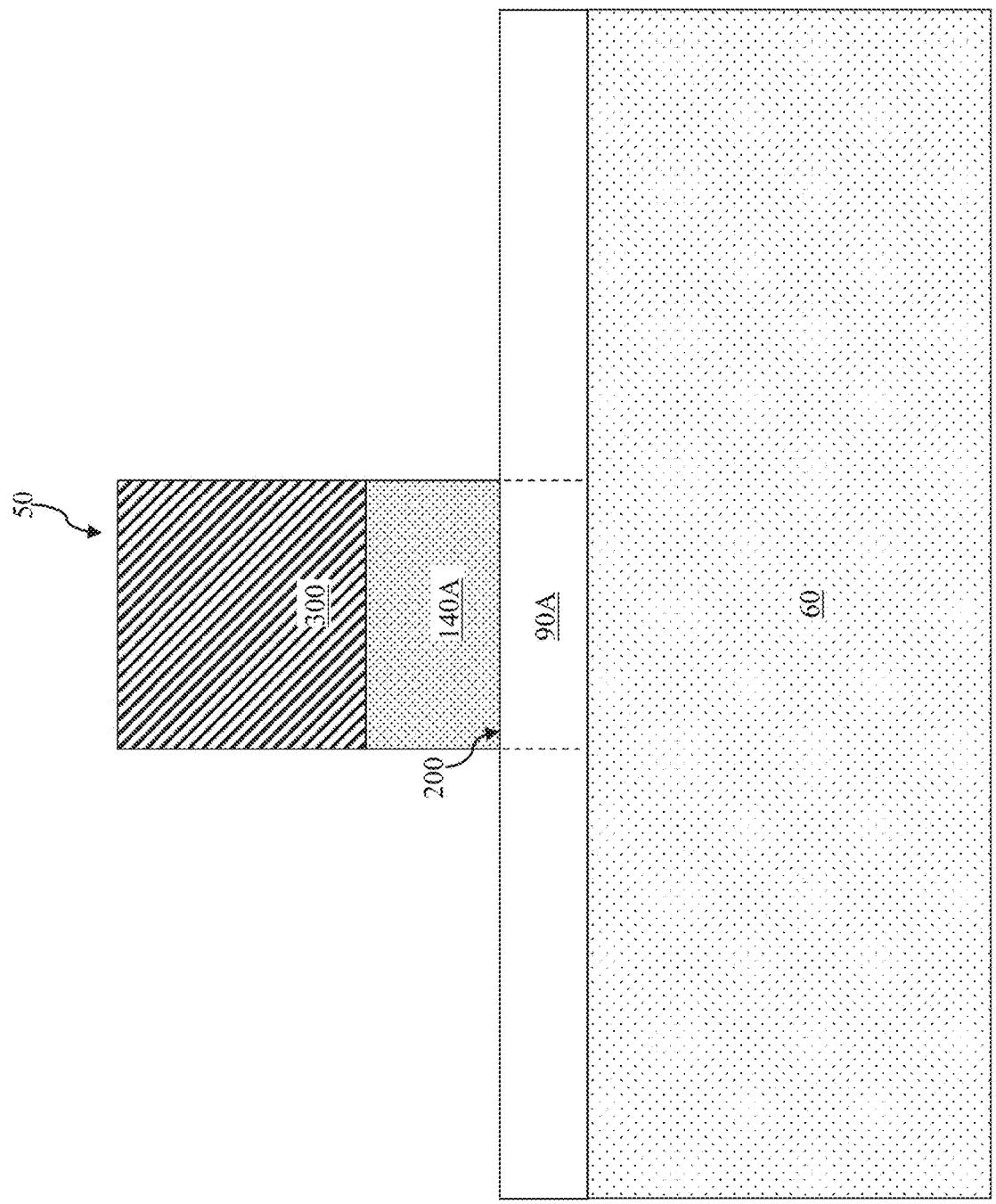

Referring now to FIG. 4, a capping layer 220 is formed. In some embodiments, the capping layer 220 contains aluminum oxide ($Al_2O_3$). The capping layer 220 may be formed by another suitable atomic layer deposition process. Among other things, the capping layer 220 helps prevent the rare earth oxide layer 140 therebelow from absorbing moisture upon air exposure. However, it is understood that the capping layer is not restricted to $Al_2O_3$. In some embodiments, the capping layer may contain a material having a higher dielectric constant than that of $Al_2O_3$. It is also understood that the formation of the capping layer 220 may be optional. For example, in some embodiments, the wafer (on which the layers 90, and 140 are formed) may be transferred from one fabrication tool (e.g., an atomic layer deposition tool) to another fabrication tool (e.g., another atomic layer deposition tool) via a vacuum chamber, so that the rare earth oxide layer 140 is prevented from exposure to air or moisture before another layer (e.g., titanium nitride) is formed thereon.

Additional fabrication processes are performed to complete the fabrication of the semiconductor device 50. For example, referring to FIG. 5, the semiconductor device 50 is formed as a metal-oxide semiconductor field effect transistor (MOSFET) 50. A portion of the epi-layer 90 may be used to implement a channel region 90A of the transistor 50. The III-V compound material (e.g., GaAs) of the layer 90 is well suited for the channel 90A, since the III-V compound has high electron mobility. The rare earth oxide layer 140 may be patterned (by one or more photolithography processes) to implement a gate dielectric 140A of a gate structure of the transistor 50. In some embodiments, the gate dielectric 140 may include another oxide material (or another suitable dielectric material) formed over the rare earth oxide material.

The gate structure of the transistor 50 further includes a gate electrode 300. The gate electrode 300 may include a polysilicon gate electrode in some embodiments, or it may include a metal gate electrode in other embodiments. The metal gate electrode may contain a work function metal component that tunes a work function of the gate, such that a desired threshold voltage may be achieved for the transistor. In some embodiments, the work functional metal component may include titanium nitride (TiN), tungsten (W), tungsten nitride (WN), or tungsten aluminum (WAl). The metal gate electrode may further contain a fill metal component that serves as the main conductive portion of the gate electrode. The fill metal component may contain aluminum (Al), titanium (Ti), tungsten (W), or copper (Cu).

The transistor 50 may further include spacers, source/drain regions, and conductive contacts for establishing electrical interconnections. For reasons of simplicity, however, these additional components of the transistor 50 are not specifically illustrated herein.

Experimental data has confirmed that the transistor 50 formed herein offers improved performance over conventional transistors. For example, the transistor 50 can attain good capacitance-voltage profiling (C-V profiling), which is a common technique used to determine or characterize the semiconductor parameters. For example, the capacitance-voltage dispersion of the transistor 50 has been measured as low as 5%-7% for p-type devices, and as low as 9%-14% for n-type devices. The transistor 50 can also achieve good current density versus electric field (J-E). In some embodiments, the current density is about $10^{-8}$ amps/centimeter$^2$.

Figure 6:
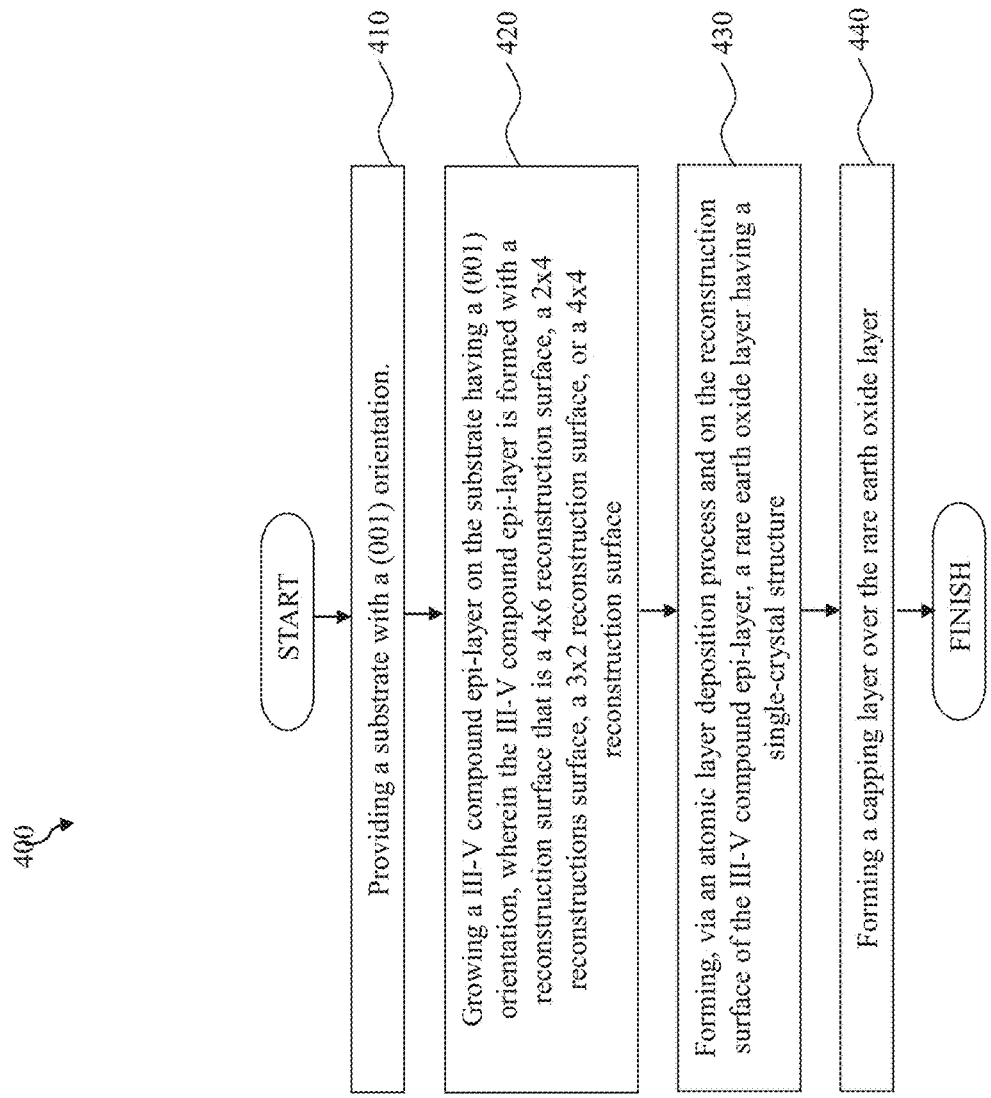
FIG. 6 is a flow chart illustrating a method of fabricating a semiconductor device in accordance with embodiments of the present disclosure.

FIG. 6 is a flowchart of a method 400 for fabricating a semiconductor device in accordance with various aspects of the present disclosure. The method 400 includes a step 410 of providing a substrate with a (001) orientation. In some embodiments, the substrate is a silicon substrate with the (001) orientation. In other embodiments, the substrate is a GaAs substrate with the (001) orientation.

The method 400 includes a step 420 of growing a III-V compound epi-layer on the substrate having a (001) orientation. The III-V compound epi-layer is formed with a reconstruction surface that is a 4×6 reconstruction surface, a 2×4 reconstruction surface, a 3×2 reconstruction surface, a 2×1 reconstruction surface, or a 4×4 reconstruction surface. In some embodiments, a gallium arsenide (GaAs) epi-layer is grown on a GaAs layer having the (001) orientation. In some embodiments, the reconstruction surface is obtained via an annealing process performed in a vacuum environment.

The method 400 includes a step 430 of forming, on the reconstruction surface of the III-V compound epi-layer, a rare earth oxide layer having a single-crystal structure. The rare earth oxide layer is performed via an atomic layer deposition process. In some embodiments, the forming of the rare earth oxide layer is performed without treating the reconstruction surface prior to the atomic layer deposition process. In some embodiments, the atomic layer deposition process is a thermal atomic layer deposition process. In some embodiments, the atomic layer deposition process is performed using an oxygen source precursor and an yttrium source precursor. In some embodiments, the oxygen source precursor includes $H_2O$ or $O_3$, and the yttrium source precursor includes a cyclopentadienyl-type compound. In some embodiments, an exposure time under the yttrium source precursor is greater than about 1 second. In some embodiments, a purge time is greater than about 8 seconds. In some embodiments, a ratio of the purge time to the exposure time is greater than about 3. In some embodiments, a temperature of the oxygen source precursor is at about 25 degrees Celsius. In some embodiments, a temperature of the yttrium source precursor is greater than about 110 degrees Celsius. In some embodiments, a growth temperature of the atomic layer deposition process is in a range from about 270 degrees Celsius to about 320 degrees Celsius. In some embodiments, a growth pressure of the atomic layer deposition process is in a range from about 4 hPa to about 10 hPa.

The method 440 includes a step 440 of forming a capping layer over the rare earth oxide layer. In some embodiments, the capping layer includes aluminum oxide. The capping layer may be formed by an atomic layer deposition process.

It is understood that additional process steps may be performed before, during, or after the steps 410-440 discussed above to complete the fabrication of the semiconductor device. For example, a gate dielectric may be formed by patterning the rare earth oxide, and a gate electrode may be formed on the rare earth oxide. Other process steps are not discussed herein for reasons of simplicity.

Based on the above discussions, it can be seen that the present disclosure offers advantages over conventional semiconductor fabrication. It is understood, however, that other embodiments may offer additional advantages, and not all advantages are necessarily disclosed herein, and that no particular advantage is required for all embodiments. One advantage is that the present disclosure achieves—via an atomic layer deposition process—single-crystal growth of rare earth oxides (e.g., $Y_2O_3$) on a III-V compound (e.g., GaAs) having a (001) orientation. This offers easy integration with silicon (001) substrates as well improved semiconductor performance. For example, the capacitance-voltage profile as well as the current density versus electric field performance of the semiconductor device have been improved. In addition, the interface of the rare earth oxide and the III-V compound is formed with a high quality and can thermally withstand up to 950 degrees Celsius, which may possibly render the gate-last fabrication approach unnecessary. Furthermore, atomic layer deposition is a proven technique for mass production of semiconductor devices, and thus the present disclosure is compatible with existing fabrication technologies with high likelihood of mass production success.

One aspect of the present disclosure involves a method of fabricating a semiconductor device. A III-V compound epi-layer is grown on a substrate having a (001) orientation. The III-V compound epi-layer is formed with a reconstruction surface that is a 4×6 reconstruction surface, a 2×4 reconstruction surface, a 3×2 reconstruction surface, a 2×1 reconstruction surface, or a 4×4 reconstruction surface. On the reconstruction surface of the III-V compound epi-layer, a rare earth oxide layer having a single-crystal structure is formed. The forming of the rare earth oxide layer is performed via an atomic layer deposition process.

Another aspect of the present disclosure involves a method of fabricating a semiconductor device. A substrate that has a (001) orientation is provided. A GaAs layer is epitaxially grown on the substrate. The second GaAs layer has a reconstruction surface that is a 4×6 reconstruction surface, a 2×4 reconstruction surface, a 3×2 reconstruction surface, a 2×1 reconstruction surface, or a 4×4 reconstruction surface. Via an atomic layer deposition process, a single-crystal structure yttrium oxide ($Y_2O_3$) layer is formed on the reconstruction surface of the GaAs layer. The atomic layer deposition process includes water or ozone gas as an oxygen source precursor and a cyclopentadienyl-type compound as an yttrium source precursor.

Yet another aspect of the present disclosure involves a semiconductor device. The semiconductor device includes a substrate orientation. A III-V compound epi-layer is disposed on the substrate. The III-V compound epi-layer has a reconstruction surface that is one of: a 4×6 reconstruction surface, a 2×4 reconstruction surface, a 3×2 reconstruction surface, a 2×1 reconstruction surface, or a 4×4 reconstruction surface. A rare earth oxide layer is disposed on the reconstruction surface of the III-V compound epi-layer. The rare earth oxide layer has a single-crystal structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate having a (001) orientation according to a Miller Index;
    a III-V compound epi-layer disposed on the substrate, wherein the III-V compound epi-layer has a reconstruction surface that is a 3×2 reconstruction surface or a 4×4 reconstruction surface, wherein the III-V compound epi-layer has a single crystal structure; and
    a rare earth oxide layer disposed on the reconstruction surface of the III-V compound epi-layer, wherein the rare earth oxide layer has a single-crystal structure, wherein an interface between the III-V compound epi-layer and the rare earth oxide layer has a roughness that is less than about 0.5 nanometers and is thermally stable up to about 950 degrees Celsius.

2. The semiconductor device of claim 1, wherein the III-V compound epi-layer contains gallium arsenide (GaAs), gallium indium arsenide (GaInAs), gallium antimonide (GaSb), indium arsenide (InAs), indium phosphide (InP), gallium indium phosphide (GaInP), or gallium indium antimonide (GaInSb).

3. The semiconductor device of claim 1, wherein the rare earth oxide layer contains: yttrium oxide (Y2O3), scandium oxide (Sc2O3), lanthanum oxide (La2O3), cerium oxide (Ce2O3), praseodymium oxide (Pr2O3), neodymium oxide (Nd2O3), samarium oxide (Sm2O3), europium oxide (Eu2O3), gadolinium oxide (Gd2O3), dysprosium oxide (Dy2O3), holmium oxide (Ho2O3), erbium oxide (Er2O3), lutetium oxide (Lu2O3), yttrium aluminum oxide (YAlO3), lanthanum aluminum oxide (LaAlO3), lanthanum lutetium oxide (LaLuO3), lanthanum gallium oxide (LaGaO3), or neodymium aluminum oxide (NdAlO3).

4. The semiconductor device of claim 1, further comprising: a capping layer disposed on the rare earth oxide layer.

5. The semiconductor device of claim 4, wherein a dielectric constant of the capping layer is at least as high as a dielectric constant of aluminum oxide.

6. The semiconductor device of claim 1, wherein the semiconductor device includes a transistor having a gate dielectric, and wherein the gate dielectric comprises the rare earth oxide layer.

7. The semiconductor device of claim 1, wherein the rare earth oxide layer is in direct contact with the III-V compound epi-layer.

8. The semiconductor device of claim 1, wherein the substrate includes single-crystal silicon substrate.

9. The semiconductor device of claim 1, wherein the substrate includes a III-V compound substrate.

10. The semiconductor device of claim 1, wherein the III-V compound epi-layer has the (001) orientation according to the Miller Index.

11. The semiconductor device of claim 1, wherein the rare earth oxide layer consists of yttrium oxide.

12. A semiconductor device, comprising:
    a substrate having a (001) orientation according to a Miller Index;
    a MN compound layer epitaxially grown on the substrate, wherein the III-V compound layer includes an element from a "μI" group of a periodic table and an element from a "V" group of the periodic table, and wherein the MN compound layer has a reconstruction surface that is a 3×2 reconstruction surface or a 4×4 reconstruction surface; and a rare earth oxide layer formed directly on, and in physical contact with, the reconstruction surface of the MN compound layer, wherein the rare earth oxide layer is a part of a gate dielectric of a transistor;

wherein:

the III-V compound layer and the rare earth layer each have a single-crystal structure; and an interface between the III-V compound layer and the rare earth layer has a roughness that is less than about 0.5 nanometers and is thermally stable up to about 950 degrees Celsius.

13. The semiconductor device of claim 12, wherein:

the III-V compound layer contains gallium arsenide (GaAs), gallium indium arsenide (GaInAs), gallium antimonide (GaSb), indium arsenide (InAs), indium phosphide (InP), gallium indium phosphide (GaInP), or gallium indium antimonide (GaInSb); and the rare earth oxide layer contains: yttrium oxide (Y2O3), scandium oxide (Sc2O3), lanthanum oxide (La2O3), cerium oxide (Ce2O3), praseodymium oxide (Pr2O3), neodymium oxide (Nd2O3), samarium oxide (Sm2O3), europium oxide (Eu2O3), gadolinium oxide (Gd2O3), dysprosium oxide (Dy2O3), holmium oxide (Ho2O3), erbium oxide (Er2O3), lutetium oxide (Lu2O3), yttrium aluminum oxide (YAlO3), lanthanum aluminum oxide (LaAlO3), lanthanum lutetium oxide (LaLuO3), lanthanum gallium oxide (LaGaO3), or neodymium aluminum oxide (NdAlO3).

14. The semiconductor device of claim 12, wherein:

the substrate contains a single-crystal material or a III-V compound material.

15. The semiconductor device of claim 12, further comprising a capping layer disposed over the rare earth oxide layer, wherein the capping layer contains aluminum oxide or a dielectric material having a greater dielectric constant than aluminum oxide.

16. The semiconductor device of claim 12, wherein the III-V compound layer has the (001) orientation according to the Miller Index.

17. The semiconductor device of claim 12, wherein the rare earth oxide layer consists of yttrium oxide.

18. A semiconductor device, comprising:

a substrate having a (001) orientation according to a Miller Index, wherein the substrate contains a single-crystal material or a III-V compound material;

a first layer epitaxially grown on the substrate, wherein the first layer contains gallium arsenide (GaAs), gallium indium arsenide (GaInAs), gallium antimonide (GaSb), indium arsenide (InAs), indium phosphide (InP), gallium indium phosphide (GaInP), or gallium indium antimonide (GaInSb), and wherein the first layer has a reconstruction surface that is one of: a 3×2 reconstruction surface, a 2×1 reconstruction surface, or a 4×4 reconstruction surface; and a second layer disposed on the reconstruction surface of the first layer, wherein the second layer contains: yttrium oxide (Y2O3), scandium oxide (Sc2O3), lanthanum oxide (La2O3), cerium oxide (Ce2O3), praseodymium oxide (Pr2O3), neodymium oxide (Nd2O3), samarium oxide (Sm2O3), europium oxide (Eu2O3), gadolinium oxide (Gd2O3), dysprosium oxide (Dy2O3), holmium oxide (Ho2O3), erbium oxide (Er2O3), lutetium oxide (Lu2O3), yttrium aluminum oxide (YAlO3), lanthanum aluminum oxide (LaAlO3), lanthanum lutetium oxide (LaLuO3), lanthanum gallium oxide (LaGaO3), or neodymium aluminum oxide (NdAlO3);

wherein:

the first layer and the second each have a single-crystal structure; and an interface between the first layer and the second layer has a roughness that is less than about 0.5 nanometers and is thermally stable up to about 950 degrees Celsius.

19. The semiconductor device of claim 18, further comprising a third layer disposed over the second layer, wherein the third layer contains aluminum oxide or a dielectric material having a greater dielectric constant than aluminum oxide.

20. The semiconductor device of claim 18, wherein the second layer is a part of a gate dielectric of a transistor.

* * * * *